United States Patent
Tung et al.

(10) Patent No.: US 9,496,169 B2
(45) Date of Patent: Nov. 15, 2016

(54) METHOD OF FORMING AN INTERCONNECT STRUCTURE HAVING AN AIR GAP AND STRUCTURE THEREOF

(71) Applicant: Taiwan Semiconductor Manufacturing Company, Ltd., Hsin-Chu (TW)

(72) Inventors: Szu-Ping Tung, Taipei (TW); Chih-Chien Chi, Hsin-Chu (TW); Hung-Wen Su, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/621,221

(22) Filed: Feb. 12, 2015

(65) Prior Publication Data

US 2016/0240428 A1 Aug. 18, 2016

(51) Int. Cl.

| H01L 21/76 | (2006.01) |
|---|---|
| H01L 21/768 | (2006.01) |
| H01L 23/528 | (2006.01) |
| H01L 21/02 | (2006.01) |
| H01L 23/532 | (2006.01) |

(52) U.S. Cl.
CPC ..... *H01L 21/7682* (2013.01); *H01L 21/02266* (2013.01); *H01L 21/76802* (2013.01); *H01L 21/76819* (2013.01); *H01L 21/76831* (2013.01); *H01L 21/76834* (2013.01); *H01L 21/76843* (2013.01); *H01L 21/76877* (2013.01); *H01L 23/528* (2013.01); *H01L 23/5329* (2013.01)

(58) Field of Classification Search
USPC ........................................................ 257/773
See application file for complete search history.

(56) References Cited

U.S. PATENT DOCUMENTS

| 6,130,151 A * | 10/2000 | Lin ........................ H01L 21/764 257/522 |
|---|---|---|
| 2005/0153566 A1* | 7/2005 | Han .................. H01L 21/76802 438/725 |
| 2006/0105567 A1* | 5/2006 | Ramachandrarao ................. H01L 21/31105 438/637 |
| 2009/0081862 A1* | 3/2009 | Chen ................. H01L 21/76831 438/618 |
| 2011/0034329 A1* | 2/2011 | Coiffic .............. H01L 21/02126 502/200 |
| 2013/0240973 A1* | 9/2013 | Matsuno ............... H01L 29/788 257/316 |
| 2015/0194333 A1* | 7/2015 | You ..................... H01L 21/7682 438/619 |

OTHER PUBLICATIONS

"Chapter 10 CVD and Dielectric Thin Film," May 23, 2006, http://www.me.ntut.edu.tw/introduction/teacher/lu/IC%20fabrication_GA/IC_ch10_short.pdf, downloaded Dec. 3, 2014, 47 pages.
Rack, "Chemical Vapor Deposition," Oct. 31, 2002, http://web.utk.edu/~prack/Thin%20films/cvd2.pdf, downloaded Apr. 25, 2016, 12 pages.

* cited by examiner

*Primary Examiner* — Thao P Le
(74) *Attorney, Agent, or Firm* — Slater Matsil, LLP

(57) ABSTRACT

A semiconductor device and method of manufacture are provided which utilize an air gap to help isolate conductive structures within a dielectric layer. A first etch stop layer is deposited over the conductive structures, and the first etch stop layer is patterned to expose corner portions of the conductive structures. A portion of the dielectric layer is removed to form an opening. A second etch stop layer is deposited to line the opening, wherein the second etch stop layer forms a stepped structure over the corner portions of the conductive structures. Dielectric material is then deposited into the opening such that an air gap is formed to isolate the conductive structures.

20 Claims, 13 Drawing Sheets

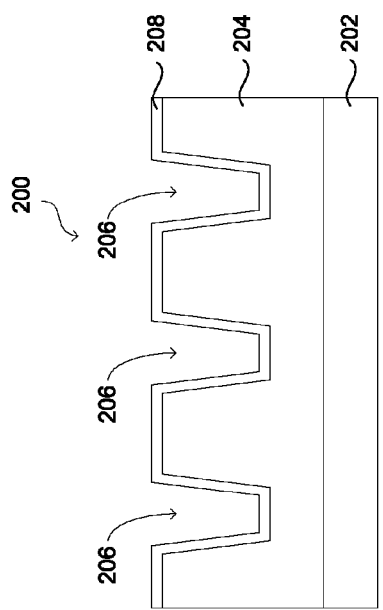
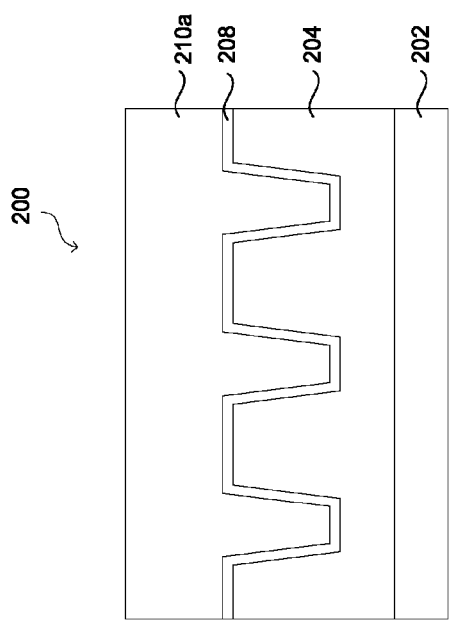
FIG. 2
FIG. 3

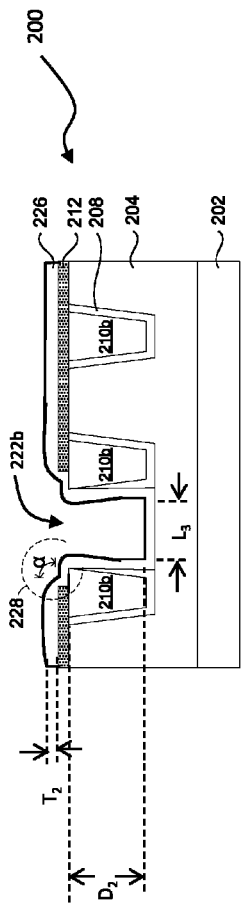
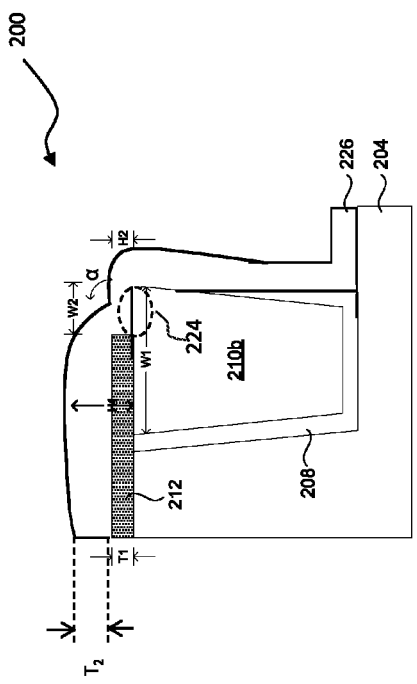
FIG. 8
FIG. 9

METHOD OF FORMING AN INTERCONNECT STRUCTURE HAVING AN AIR GAP AND STRUCTURE THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the capacitive coupling between adjacent elements. For example, in back-end of line (BEOL) interconnect structures, for any two adjacent conductive lines, when the distance between the conductive lines decreases, the resulting capacitance (a function of the dielectric constant (k value) of the insulating material divided by the distance between the conductive features) increases. This increase in capacitive coupling further results in increased parasitic capacitance, which negatively impacts the speed and overall performance of the IC device.

Improved methods of reducing capacitance between interconnect lines are desired.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11 are cross-sectional views of a portion of a semiconductor device having an interconnect structure at various stages of fabrication, according to one embodiment of the present disclosure.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
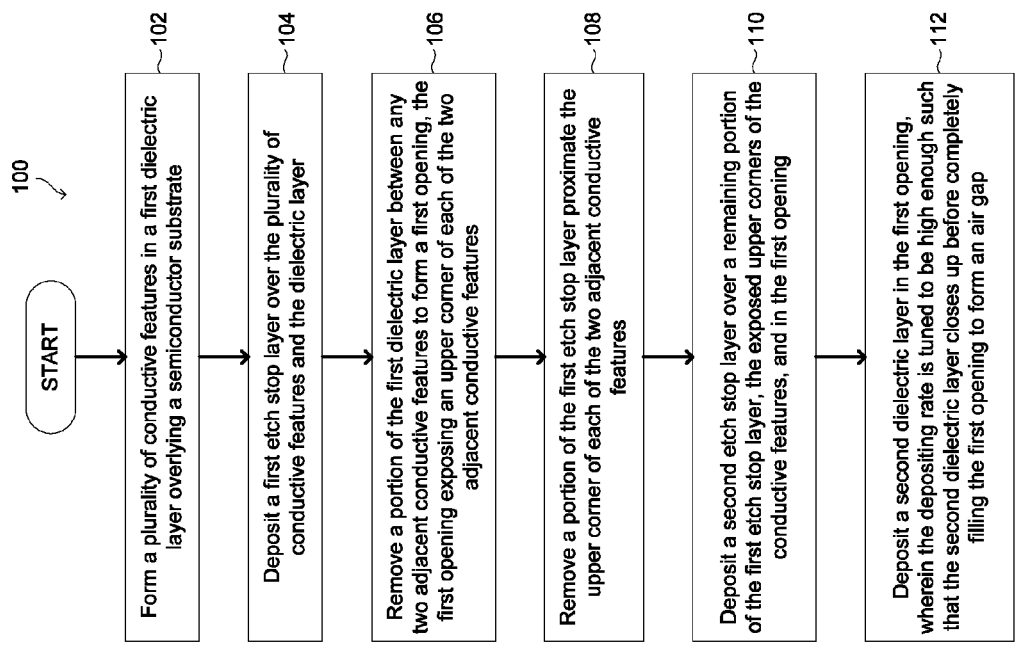
FIG. 1 is a flowchart of a method of fabricating a semiconductor device having an interconnect structure, according to one or more embodiments of the present disclosure.

FIG. 1 is a flowchart of a method 100 of fabricating a semiconductor device having an interconnect structure, according to various aspects of the present disclosure. Referring to FIG. 1, the method 100 includes block 102, in which a plurality of conductive features is formed in a first dielectric layer overlying a semiconductor substrate. The method 100 includes block 104, in which a first etch stop layer (ESL) is deposited over the plurality of conductive features and the first dielectric layer. The method 100 includes block 106, in which a portion of the first dielectric layer between any two adjacent conductive features is removed to form a first opening there-between. The first opening exposes an upper corner of each of the two adjacent conductive features. The method 100 includes block 108, in which a portion of the first etch stop layer proximate the upper corner of each of the two adjacent conductive features is removed. The method 100 includes block 110, in which a second etch stop layer is deposited over a remaining portion of the first etch stop layer, the exposed upper corners of the conductive features, and in the first opening. The method 100 includes block 112, in which a second dielectric layer is deposited in the first opening. The deposition rate is tuned to be high enough such that the second dielectric layer closes up before completely filling the first opening to form an air gap.

In some embodiments, additional processes are performed before, during, and/or after the blocks 102-112 shown in FIG. 1 to complete the fabrication of the semiconductor device, but these additional processes are not discussed herein in detail for the sake of brevity.

FIGS. 2-11 are cross-sectional views of a semiconductor device having an interconnect structure at various fabrication stages according to one or more embodiments of the present disclosure. FIGS. 2-11 have been simplified for a better illustration of the concepts of the present disclosure. It should be appreciated that the materials, geometries, dimensions, structures, and process parameters described herein are only illustrative, and are not intended to be, and should not be construed to be, limiting to the present disclosure. Many alternatives and modifications will be apparent to those skilled in the art, once informed by the present disclosure.

Referring to FIG. 2, a semiconductor device 200 is provided. The semiconductor device 200 may be an integrated circuit (IC) chip, system on chip (SoC), or portion thereof, that may include various passive and active microelectronic devices such as resistors, capacitors, inductors, diodes, and/or transistors. The semiconductor device 200 includes a substrate 202. The substrate 202 may be a portion of a semiconductor wafer. The substrate 202 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate may be doped with a p-type dopant, such as boron, aluminum, gallium, or the like, although the substrate may alternatively be doped with an n-type dopant, as is known in the art.

The substrate 202 may include active and passive devices (not shown). As one of ordinary skill in the art will recognize, a wide variety of devices such as transistors, capacitors, resistors, inductors, combinations of these, and the like may be used to generate the structural and functional requirements of the design for the semiconductor device 200. Only a portion of the substrate 202 is illustrated in the figures, as this is sufficient to fully describe the illustrative embodiments.

A dielectric layer 204 is formed over the substrate 202. The dielectric layer 204 may be a single layer or a multi-layered structure. The dielectric layer 204 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 204 may be deposited by chemical vapor deposition (CVD), physical vapor deposition (PVD), atomic layer deposition (ALD), a spin-on-dielectric (SOD) process, the like, or a combination thereof. In an embodiment, the dielectric layer 204 is formed directly on a top surface of the substrate 202. In other embodiments, the dielectric layer 204 is formed on intermediate layers and/or structures (not shown) which are on substrate 202. In some embodiments, the dielectric layer 204 is an inter-layer dielectric (ILD).

Still referring to FIG. 2, a plurality of openings 206 are formed in dielectric layer 204, using, e.g., photolithographic masking and etching techniques, such as immersion photo-lithography, ion-beam writing, or other suitable processes. In some embodiments, a thin diffusion barrier layer 208 may be deposited by known deposition methods such as chemical vapor deposition (CVD) and formed in the openings 206 and on the dielectric layer 204. The diffusion barrier layer 208 functions to prevent metal atoms, such as copper atoms, from diffusing into the dielectric layer 204 when metal lines and/or metal vias are later formed. In an embodiment, the diffusion barrier layer 208 includes tantalum (Ta), tantalum nitride (TaNx), titanium (Ti), titanium nitride (TiNx), manganese oxide (MnOx), the like, and/or combinations thereof. In an embodiment, the diffusion barrier layer 208 has a thickness that is less than about 150 Angstroms.

Turning now to FIG. 3, a metal layer 210a is deposited over the semiconductor device filling the openings 206 of the dielectric layer 204. The metal layer 210a may include copper (Cu), aluminum (Al), tungsten (W) or other suitable conductive material. In one embodiment, the metal layer 210a includes copper or copper alloy, such as copper magnesium (CuMn), copper aluminum (CuAl), or copper silicon (CuSi). In one embodiment, the metal layer 210a is formed by a plasma vapor deposition (PVD) process that fills openings 206 and forms a blanket coating over a top surface of dielectric layer 204. The metal layer 210a may be formed to a thickness above the dielectric layer 204 of from about 500 Angstroms to about 2 μm, depending upon the desired application and the technology node employed.

In another embodiment, the metal layer 210a is formed by first depositing a seed layer by, e.g., physical vapor deposition techniques. The seed layer could be formed to a thickness of about 20 Å to about 100 Å, although other thicknesses could be employed depending upon the application and the desired process. Then a copper alloy material is formed on the seed layer using, e.g., an electro-plating or electro-less plating technique.

Figure 4:
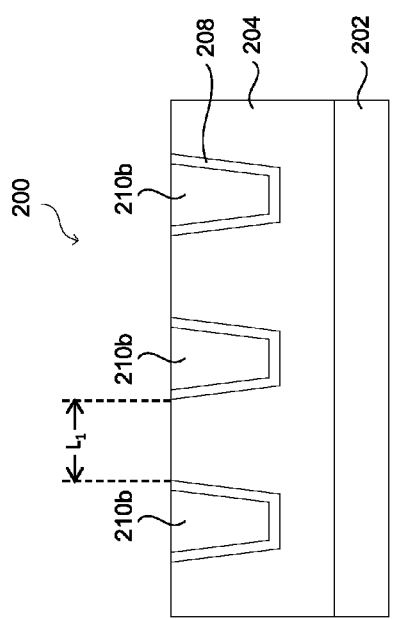

FIG. 4 illustrates a planarization of the metal layer 210a. In an embodiment the planarization may be performed using a chemical mechanical polishing (CMP) process or an etch back process to form metal features or conductive features 210b whose top is substantially co-planar with a top surface of the dielectric layer 204. When formed, the conductive features 210b may be spaced apart from each other by a first length $L_1$. In an embodiment the first length $L_1$ may be between about 5 nm and about 100 nm, such as about 30 nm. However, any suitable distance may alternatively be utilized.

Figure 5:
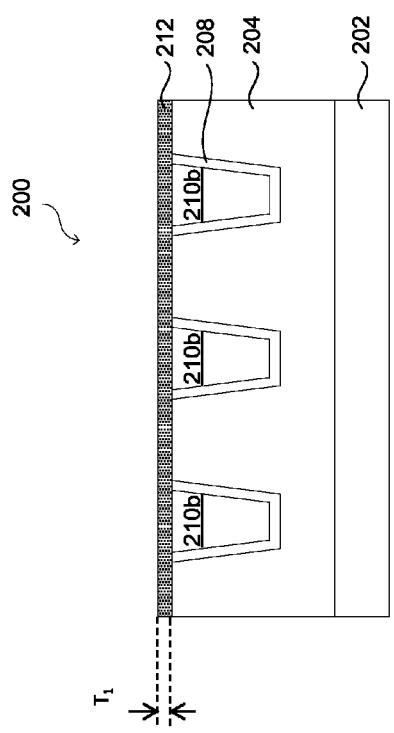

In FIG. 5, a first etch stop layer 212 is deposited over the dielectric layer 204, the conductive features 210b, and in some embodiments over the diffusion barrier layer 208. The first etch stop layer 212 is utilized to control the end point during subsequent etching processes. The first etch stop layer 212 may be made of one or more suitable dielectric materials. In some embodiments, the first etch stop layer 212 is formed of silicon oxide, silicon nitride, oxygen-doped silicon carbide, silicon carbide, silicon oxynitride, aluminum oxide, aluminum nitride, SiCN, $SiO_2$, the like, or combinations of these. It is understood that the first etch stop layer 212 can be formed of any material capable of functioning as a stop layer. In some embodiments, the first etch stop layer has a thickness from about 10 Angstroms to about 3,000 Angstroms. The first etch stop layer 212 is formed through any of a variety of deposition techniques, including chemical vapor deposition (CVD), LPCVD (low-pressure chemical vapor deposition), APCVD (atmospheric-pressure chemical vapor deposition), PECVD (plasma-enhanced chemical vapor deposition), physical vapor deposition (PVD), plasma-enhanced atomic layer deposition (PE-ALD), sputtering, or any other suitable deposition procedures. In one embodiment, the first etch stop layer 212 is deposited over the semiconductor device 200 at a process temperature of around 600 degrees Celsius, at a pressure of from about 0 to about 100 Torr, for from about 1 second to about 60 minutes. One of skill in the art understands that any suitable process may be utilized to form first etch stop layer 212.

In some embodiments, the first etch stop layer 212 has a first thickness $T_1$ of less than about 1,000 Angstroms. In other embodiments, the first thickness $T_1$ is between about 5 Angstroms and about 300 Angstroms. In some embodiments, an etch stop layer having a thickness from about 5 Angstroms to about 300 Angstroms allows a stepped structure in conjunction with a second etch stop layer to be formed in a manner that forms an air gap at a position between any two of the conductive features 210b (not illustrated in FIG. 5 but illustrated and described further below with respect to FIG. 10C).

Figure 6:
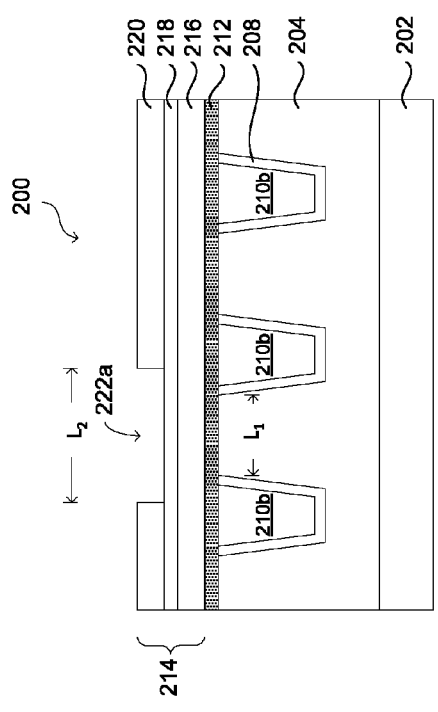

FIG. 6 illustrates an intermediate step in a formation of a mask 214 over the first etch stop layer 212. In an embodiment, the mask 214 is a tri-layer photoresist layer having a bottom layer 216, a middle layer 218, and a top layer 220. While a single patterned photoresist layer could be employed as the mask 214, a tri-layer mask allows for the formation of finer features having smaller dimensions and pitch. In the embodiment illustrated in FIG. 6, the bottom layer 216 may be a carbon organic layer, similar to a photoresist layer. The middle layer 218 is a silicon containing carbon film in some embodiments, employed to help pattern the bottom layer 216. The top layer 220 having opening 222a is a photoresist material, such as for instance, a photoresist material designed for exposure to 193 nm wavelengths, and preferably designed for immersion lithography, for instance.

The top layer 220 may be formed by known procedures such as, for example coating, exposure, post exposure baking, and developing. In one embodiment, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the photoresist layer is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. The lithography processes described above may only present a subset of processing steps associated with a lithography patterning technique. The lithography process may further include other steps such as cleaning and baking in a proper sequence. For example, the developed resist layer may be further baked, referred to as hard baking. One skilled in the art will recognize that a positive photoresist process or a negative photoresist process could be equally applied.

The first openings 222a (only one of which is illustrated in FIG. 6), is positioned such that a portion of the dielectric layer 204 between two of the conductive features 210b will be exposed for a subsequent etching process (described below with respect to FIG. 7). As such, in order to ensure that the subsequent etching process removes the dielectric layer 204 from between adjacent conductive features 210b, the first openings 222a is formed to have a second length $L_2$ that is larger than the first length $L_1$ (the length between adjacent ones of the conductive features 210b).

Additionally, to further ensure that the overlay problems are addressed, the second length $L_2$ may be large enough to not only ensure that the subsequent etching process removes the dielectric layer 204 from between the conductive features 210b, but will also remove the first etch stop layer 212 from a portion of the conductive features 210b and thereby expose a corner region of the conductive features 210b (as discussed further below with respect to FIG. 7). In such an embodiment the second length $L_2$ may be larger than the first length by between about 0.1 nm and about 40 nm, such as about 20 nm, for a total second length $L_2$ of between about 5 nm and about 150 nm, such as about 50 nm.

By forming the second length $L_2$ to be larger than the first length $L_1$, and then subsequently dealing with the exposed corners of the conductive features 210b (as described further below with respect to FIG. 7), previous concerns regarding overlay issues may be avoided. In particular, by forming the second length $L_2$ to be larger than the first length $L_1$, the corner region of the conductive features 210b are intentionally exposed and subsequently protected (as described further below with respect to FIG. 8). As such, problems caused by unintentional and undesired exposure of the corner regions may be avoided.

Figure 7:
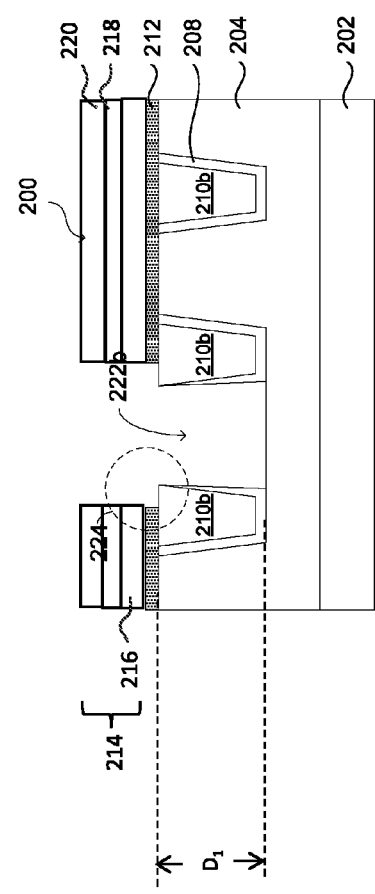

FIG. 7 illustrates a subsequent use of the openings 222a as a mask in order to etch through the first etch stop layer 212. In an embodiment the etch through the first etch stop layer 212 is performed to extend the first openings 222a through the first etch stop layer 212 to form a second opening 222b within the first etch stop layer 212 with the second length $L_2$. As such, the etch through the first etch stop layer 212 may be performed using an anisotropic etching process, such as a reactive ion etch, although any suitable etching process may alternatively be utilized.

Once the etch process has etched through the first etch stop layer 212, the second length $L_2$ of the first openings 222a causes the dielectric layer 204 between the conductive features 210b along with corner regions (represented in FIG. 7 by the dashed circled labeled 224) of the conductive features 210b (and portions of the diffusion barrier layer 208) to be exposed. At this point, the etching process continues by removing the exposed dielectric layer 204 between the conductive features 210b without significantly removing the material of the conductive features 210b (although material of the diffusion barrier layer 208 may be removed). In an embodiment the etching process may utilize one or more wet or dry etching processes with reactants that are selective to the material of the dielectric layer 204. However, any suitable etching process or combination of etching processes may alternatively be utilized.

In an embodiment the second opening 222b may be formed to have a first depth $D_1$ that, after a deposition of a second etch stop layer 226 (not illustrated in FIG. 7 but illustrated and described below with respect to FIG. 8), and when combined with a third length $L_3$ (also not illustrated in FIG. 7 but illustrated and described below with respect to FIG. 8), will provide a suitable profile for forming an air gap 242 (also not illustrated in FIG. 7 but illustrated and described further below with respect to FIG. 10C) utilizing a deposition process such as chemical vapor deposition. For example, in an embodiment the second opening 222b may have the first depth $D_1$ of between about 10 nm and about 300 nm, such as about 40 nm.

In a particular embodiment, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming second opening 222b. Other dry-etch process may alternatively be used. The mechanism of etching in each dry-etch processes may have a physical basis (e.g., glow-discharge sputtering, or ion milling) or a chemical basis (e.g., in pure plasma etching) or a combination of the two (e.g., reactive ion etching or RIE). Thereafter, the mask 214 may be removed by a process such as wet stripping or $O_2$ plasma ashing.

FIG. 8 illustrates a formation of a second etch stop layer 226 over the first etch stop layer 212, the dielectric layer 204, the conductive features 210b, and in some embodiments over the diffusion barrier layer 208. In some embodiments, the second etch stop layer 226 prevents metal or copper diffusion from portions of the conductive features 210b that have been exposed during the etching of the dielectric layer 204 (e.g., the corner portion 224) and also works to help recover damage in the conductive feature 210b that may have occurred during the etching processes.

In other embodiments, the second etch stop layer 226 functions to control the end point during subsequent etching processes.

By using the second etch stop layer 226 to cover and seal the conductive material of the conductive features 210b that were previously exposed during the formation of the second opening 222b, overlay issues that have previously caused conductive material to diffuse and create defects can be addressed directly and defects can be prevented. In particular, while previous attempts removed only those portions of the dielectric layer 204 between the conductive features 210b, overlay issues caused by the various processing steps could have unintentionally caused the material within the conductive features 210b to have become exposed. Further, because it was unintentional, no corrective steps were utilized to prevent further degradation. However, by affirmatively addressing these issues, such degradation can be prevented, and fewer defective parts may be manufactured, leading to an increase in overall yield.

In some embodiments, the second etch stop layer 226 is one or more suitable dielectric materials. In some embodiments, the second etch stop layer 226 is formed of silicon oxide, silicon nitride, oxygen-doped silicon carbide, silicon carbide, silicon oxynitride, aluminum oxide, aluminum nitride, SiCN, $SiO_2$, the like, or combinations of these. It is understood that the second etch stop layer 226 can be formed of any material capable of functioning as a stop layer. Additionally, in some embodiments, the material of the second etch stop layer 226 is the same as the first etch stop layer 212, although in other embodiments, the material of the second etch stop layer 226 is different from the first etch stop layer 212.

The second etch stop layer 226 may be formed through any of a variety of deposition techniques, including chemical vapor deposition (CVD), LPCVD (low-pressure chemical vapor deposition), APCVD (atmospheric-pressure chemical vapor deposition), PECVD (plasma-enhanced chemical vapor deposition), physical vapor deposition (PVD), plasma-enhanced atomic layer deposition (PE-ALD), sputtering, and/or future-developed deposition procedures. In one embodiment, the second etch stop layer 226 is deposited conformally over the semiconductor device 200 using a conformal deposition process such as CVD. In this embodiment, the deposition process may be performed at a process temperature of around 600 degrees Celsius, at a pressure of from about 0 to about 100 Torr, for from about 1 second to about 60 minutes. One of skill in the art understands that any suitable process may be utilized to form the second etch stop layer 226.

In some embodiments, the second etch stop layer 226 has a second thickness $T_2$ of less than about 1,000 Angstroms, such as from about 5 Angstroms to about 300 Angstroms. By forming the second etch stop layer 226 to have the second thickness $T_2$, a stepped structure (illustrated in FIG. 8 by the dashed circle labeled 228), may be formed from the second etch stop layer 226 as the second etch stop layer 226 covers the first etch stop layer 212, the exposed conductive feature 210b, and then lines the sidewalls of the second openings 222b. Additionally, by lining the second openings 222b, the formation of the second etch stop layer 226 will reduce the width of the second openings 222b by double the thickness of the second etch stop layer 226 (one on each side of the second openings 222b) as well as reduce the depth of the second openings 222b. As such, the second opening 222b may now have a third length $L_3$ of between about 5 nm and about 100 nm, such as about 30 nm, and the second opening 222b may have a second depth $D_2$ of between about 10 nm and about 1000 nm, such as about 30 nm.

In some embodiments, a ratio of the second depth $D_1$ to the third length $L_3$ will have a ratio between about 1 to 30, such as between about 2 to 5. By forming the second openings 222b to have such a ratio, a subsequent deposition of the second dielectric layer 240 (not illustrated in FIG. 8 but illustrated and described below with respect to FIGS. 10A-10C) will be formed to additionally form an air gap between adjacent ones of the conductive features 210b. However, any suitable ratio may alternatively be utilized.

Additionally, within the stepped structure 228, a step angle α may be formed between a surface of one step and an adjoining surface of the one step. When a conformal deposition process, such as a CVD process, is utilized to form the second etch stop layer 226, the step angle α may range from about 90° to about 150°, in order to create the stepped structure.

FIG. 9 illustrates a blown up view of a portion of the semiconductor device 200 showing various dimensions of the parts of the semiconductor device 200, such as the first etch stop layer 212, the second etch stop layer 226, and the conductive features 210b. As discussed above with respect to FIG. 7, following the etching of dielectric layer 204, corner portions 224 of each of the conductive features 210b will be exposed. In some embodiments in which the conductive features 210b has a first width $W_1$ or critical dimension, the exposed corner portion 224 may have a second width $W_2$ that is determined according to the following formula:

$$W_2 = 10\% - 80\% (W_1)$$

As an example, in an embodiment in which the first width $W_1$ is between about 10 nm and about 100 nm, the second width $W_2$ is between about 1 nm and about 80 nm.

Also, the combined structure of the first etch stop layer 212 and the second etch stop layer 226 may have a first height $H_1$ that is a combination of the first thickness $T_1$ (of the first etch stop layer 212) and the second thickness $T_2$ (of the second etch stop layer 226). For example, the combined structure of the first etch stop layer 212 and the second etch stop layer 226 may have the first height $H_1$ as given by the following formula:

$$H_1 = T_1 + T_2$$

where the first thickness $T_1$ is the thickness of first etch stop layer 212, the second thickness $T_2$ is the thickness of second etch stop layer 226, and the first height $H_1$ is the combined thickness of the first etch stop layer 212 and the second etch stop layer 226.

Additionally, within the stepped structure 228 itself, the second etch stop layer 226 may have a second height $H_2$ determined by the following formula:

$$H_2 = 10\% - 90\% (H_1)$$

Figure 10A:
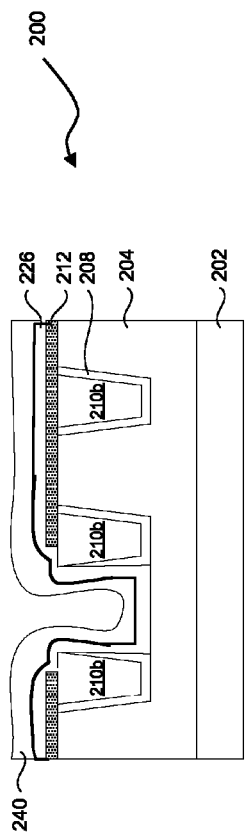
Figure 10B:
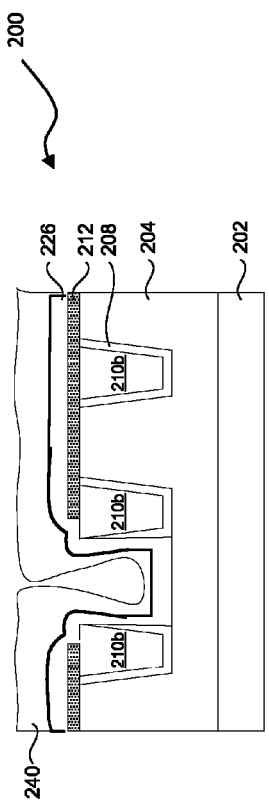
Figure 10C:
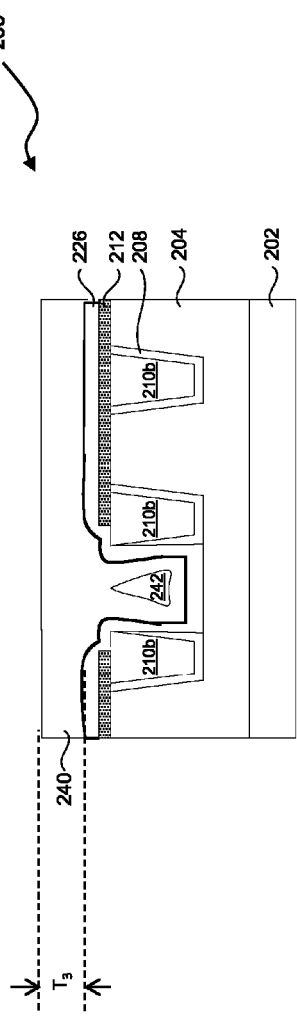

FIGS. 10A-10C illustrate a formation of a second dielectric layer 240 over and within the second opening 222b. In an embodiment the second dielectric layer 240 is a dielectric material, such as silicon oxide, silicon nitride, a dielectric material having a dielectric constant (k) lower than thermal silicon oxide (thereafter referred to as low-k dielectric material layer), or other suitable dielectric material layer. In various examples, the low k dielectric material may include fluorinated silica glass (FSG), carbon doped silicon oxide, Xerogel, Aerogel, amorphous fluorinated carbon, Parylene, BCB (bis-benzocyclobutenes), polyimide, and/or other materials as examples. In another example, the low k dielectric material may include an extreme low k dielectric material (XLK).

In one particular embodiment, the second dielectric layer 240 is formed using a chemical vapor deposition process, wherein the deposition process is tuned such that the dimensions of the second opening 226b and the deposition rate are such that the chemical vapor deposition process will not completely fill the second opening 226b but, rather, will form the desired air gap 242 between adjacent conductive features 210b. For example, when the second opening 226b has the third length $L_3$ and the second depth $D_2$ as described above with respect to FIG. 8), and in which silicon oxide is deposited, the chemical vapor deposition process may be begun by introducing precursor materials such as silane ($SiH_4$) and oxygen ($O_2$) to the second etch stop layer 226. In an embodiment the silane is introduced at a flow rate of between about 100 sccm and about 10000 sccm, such as about 2000 sccm, while the oxygen is introduced at a flow rate of between about 500 sccm and about 10000 sccm, such as about 4000 sccm. Further, the deposition may be performed at a temperature of between about 200° C. and about 500° C., such as about 400° C., and a pressure of between about 0.1 T and about 10 T, such as about 3 T.

By utilizing these process parameters the second dielectric layer 240 will be deposited with a relatively high rate of deposition, such as a rate of deposition of between about 1 nm/s and about 10 nm/s, such as about 3 nm/s. With such a rate of deposition, and with the dimensions of the second opening 226b as described above, the air gap 242 will be formed between the conductive features 210b, thereby further isolating the conductive features 210b from each other.

FIG. 10A illustrates an initial part of an embodiment of the deposition process. As illustrated, the deposition process for the second dielectric layer 240 will begin by initially forming a layer of the second dielectric layer 240. This layer will begin to cover the sidewalls of the second opening 222b as well as covering the surfaces of the second etch stop layer 226 that are located outside of the second opening 222b.

FIG. 10B illustrates a continuation of the deposition process under the same parameters. In this process, the material of the second dielectric layer 240 continues to grow during the CVD process. However, because of the deposition rate of the second dielectric layer 240, the material of the second dielectric layer 240 will grow faster at the edges of the second openings 226b than deeper within the second openings 226b. As such, the shape of the second opening 226b changes into an inverted funnel shaped opening with a larger width closer to the substrate 202 than further from the substrate 202.

FIG. 10C illustrates a continuation of the deposition process under the same parameters. As the process continues, those portions of the second dielectric layer 240 that were growing together in FIG. 10B (the material at the edges of the second openings 226b) will come together and seal off the inverted funnel shaped opening. By sealing off this opening, further deposition into the second opening 226b is prevented and the air gap 242 is formed and sealed from further structures that may be formed in subsequent processes.

Additionally, even after the air gap 242 has been formed and sealed, the deposition process may be continued in order to provide an overlying layer that will assist in protecting the air gap 242 from being reopened during further processing. In a particular embodiment the deposition process is continued until the second dielectric material 240 has a third thickness $T_3$ over the second etch stop layer 226 of between about 10 Å and about 2000 Å, such as about 1500 Å. By continuing the deposition process, the air gap 242 may be further protected from additional processing, thereby helping to assure that the air gap 242 remains void of undesired materials that may otherwise cause defects, such as conductive materials that may cause a short.

Figure 11:
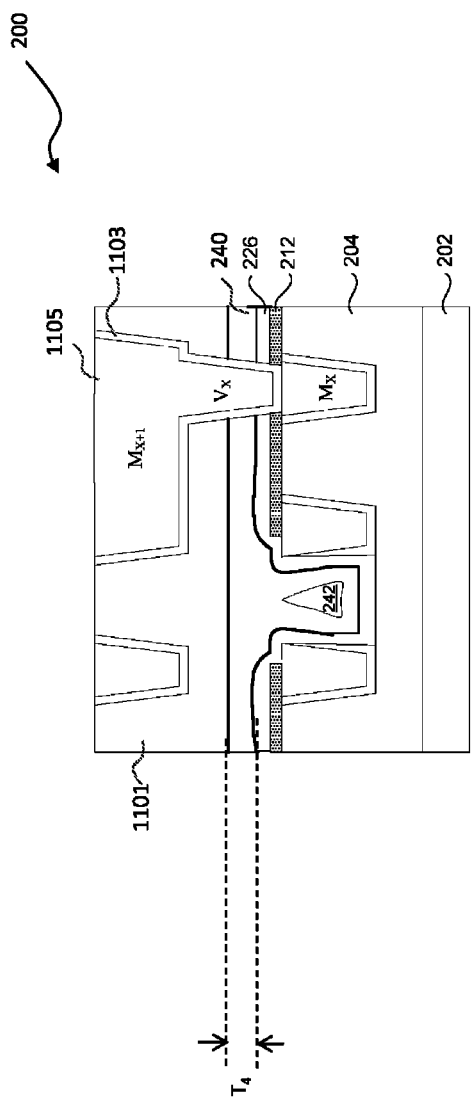

FIG. 11 illustrates a planarization process that may be utilized to remove excess second dielectric layer 240 and provide a suitable planar surface for additional processing. In an embodiment the planarization process may be performed using, for example, a chemical mechanical polishing process, in which etchants and abrasives are introduced to a surface of the second dielectric layer 240 and a platen (not separately illustrated in FIG. 11) is utilized to grind the second dielectric layer 240 until a desired thickness is achieved. In an embodiment the planarization process may be utilized to remove the second dielectric layer 240 until the dielectric layer 240 has a fourth thickness $T_4$ over the second etch stop layer 226 of between about 10 Å and about 2000 Å, such as about 1500 Å.

FIG. 11 also illustrates a formation of a second metal layer ($M_{x+1}$) over the conductive features 210b and the second dielectric layer 240 along with a via ($V_x$) to electrically interconnect the second metal layer to the conductive features 210b. In a particular embodiment a third dielectric layer 1101 is formed over the second dielectric layer 240. Once formed, the third dielectric layer 1101 may be patterned to form a via opening and trench openings using, e.g., one or more photolithographic masking and etching processes. Once the via opening and the trench openings have been formed, the via openings and the trench openings may be lined with a second barrier layer 1103, and conductive material 1105 may be plated or otherwise placed within the via opening and the trench openings. Once formed, the excess portions of the conductive material 1105 and the second barrier layer 1103 outside of the via openings and the trench opening may be removed using, e.g., a planarization process such as a chemical mechanical polish process.

It will be appreciated that the embodiments of the present disclosure may be iteratively performed to form multiple metallization layers one stacked upon another in a back-end-of-the-line stack. It is also understood that the dimensions recited are merely examples, and will change with the scaling down of integrated circuits. It is further understood that semiconductor device 200 shown in FIGS. 2-11 are only for illustrative purpose and are not limiting. Additional steps may be performed such as forming multiple metallization layers. Also, it should be understood that the ordering of the various steps discussed above with reference to FIGS. 2-11 are provided for illustrative purposes, and as such, other embodiments may utilize different sequences. These various ordering of steps are to be included within the scope of embodiments. Additional embodiments can also be conceived.

Figure 12:
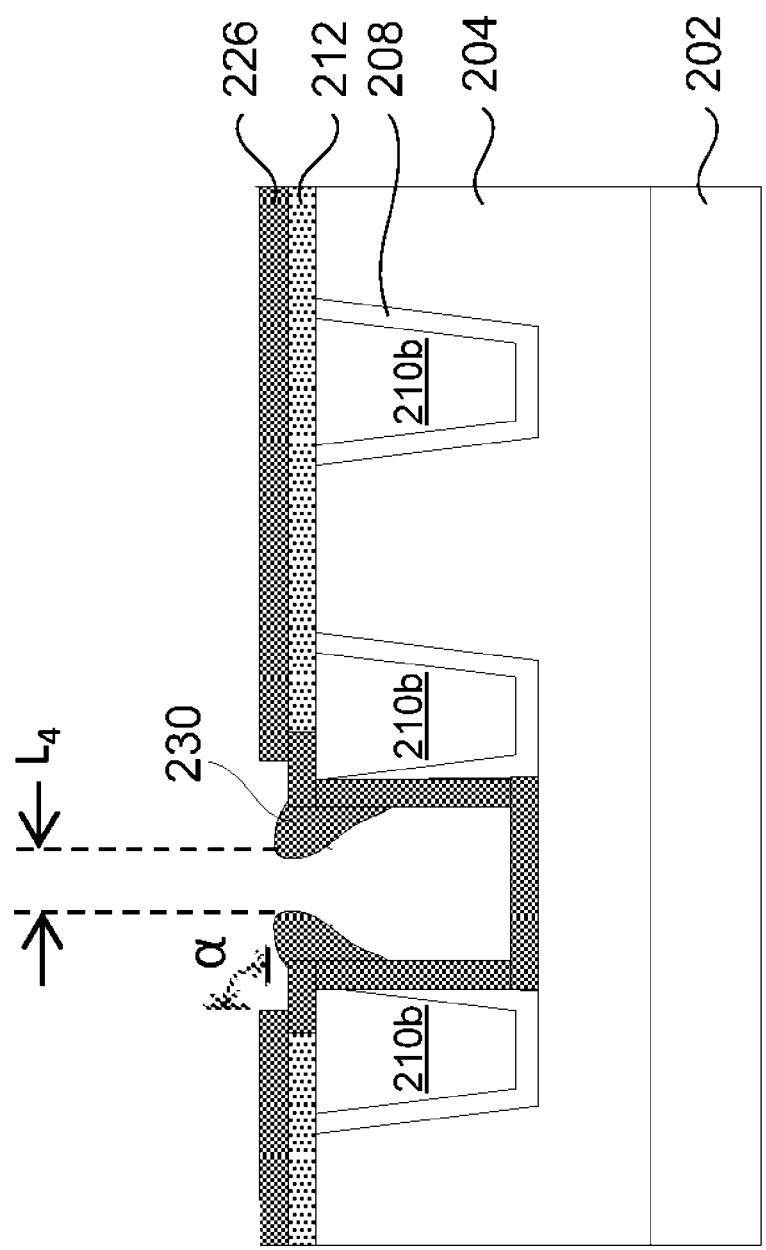
FIGS. 12-13 are cross-sectional views of a portion of a semiconductor device having an interconnect structure with overhangs at various stages of fabrication, according to another embodiment of the present disclosure.

FIG. 12 illustrates another embodiment of the formation of the second etch stop layer 226. In this embodiment, rather than utilizing a conformal deposition process such as CVD, a non-conformal deposition process is utilized in order to intentionally form overhangs 230 at the corners of the second openings 226b in order to assist with the formation and sealing of the air gap 242. In a particular embodiment the non-conformal deposition process may be a plasma vapor deposition (PVD) process, such as sputtering, whereby ions are directed to dislodge material from a target in order to direct the desired material towards the surface of the first etch stop layer 212 and the second opening 222b and form the second etch stop layer 226. By using a non-conformal deposition process, deposited material may accumulate at the corners of the second openings 226b, thereby causing the second etch stop layer 226 to form more rapidly at the corners than within the second openings 226b and causing the overhangs 230 to form.

In a particular embodiment in which a plasma vapor deposition is utilized, the second etch stop layer 226 may be formed using a target of silicon oxide and ions such as argon. Within the process, a DC power may be set to between about 0.5 KW and about 30 KW, such as about 5 KW, and an AC bias may be set to be less than about 2.5 KW, such as about 100 W. The deposition process may be performed at a temperature of between about room temperature and about 400° C., such as about 200° C. and a pressure of about 1 mT and about 100 mT, such as about 5 mT. However, any suitable processing parameters may alternatively be utilized.

In this embodiment in which the second etch stop layer 226 is formed in a non-conformal manner, the step angle α is generally less than 90° because of the overhang 230. As such, in this embodiment the step angle may range from 30° to 90°. Additionally, in order to enhance the formation of the air gap 242 (not illustrated in FIG. 12 but illustrated and described below with respect to FIG. 13) in this embodiment, the material of the overhangs 230 (one on each side of the second openings 226b) are continued to be deposited until the overhangs 230 are spaced apart from each other a fourth length $L_4$ of less than about 100 nm, such as less than about 20 nm. However, any suitable distance may alternatively be used to enhance the formation of the air gap 242.

Figure 13:
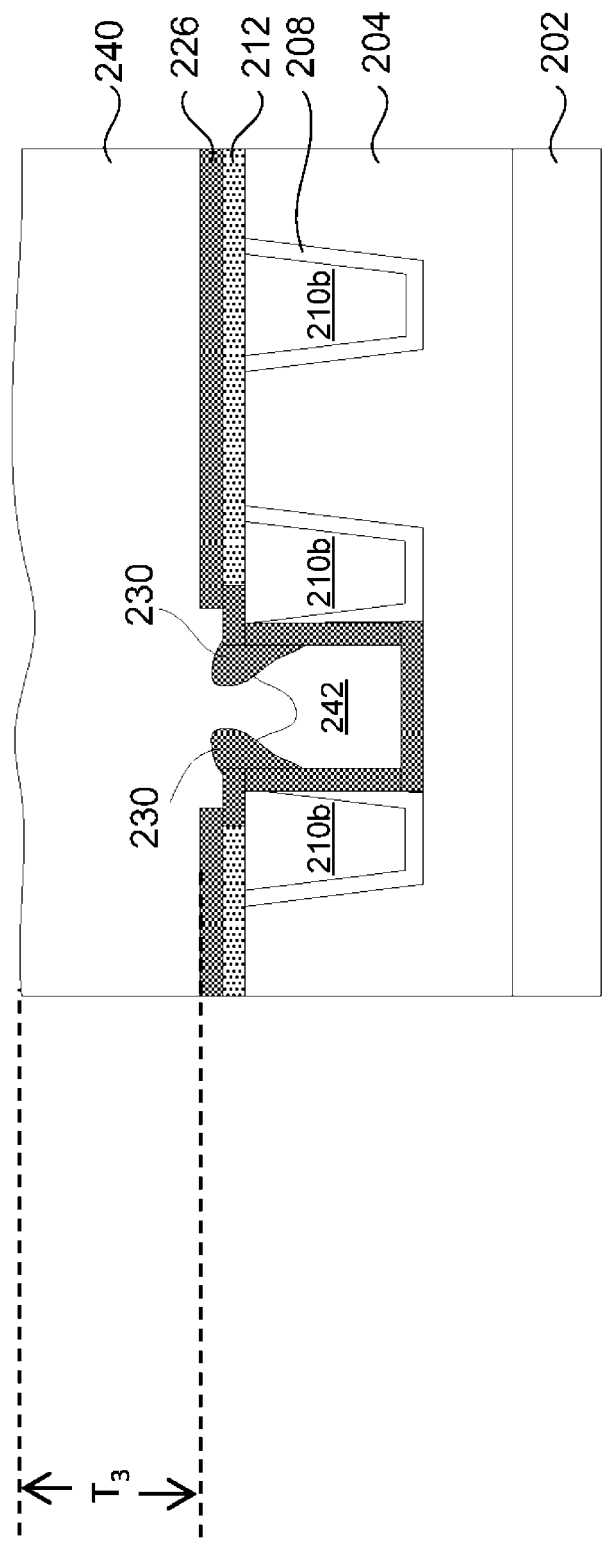
Figure 14:
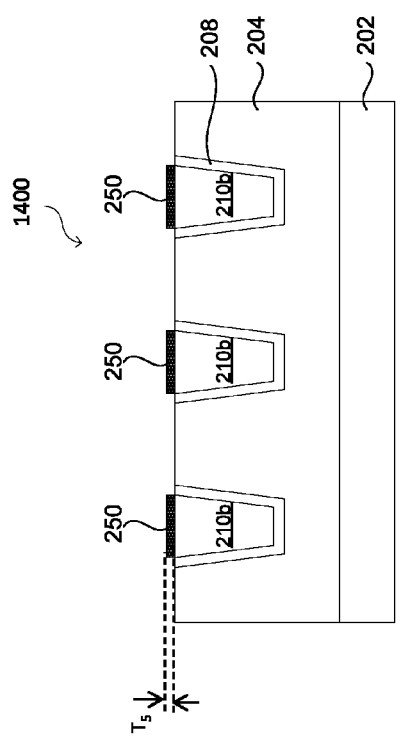
FIGS. 14-21 are cross-sectional views of a portion of a second semiconductor device having an interconnect structure at various stages of fabrication, according another embodiment of the present disclosure.

FIG. 13 illustrates a formation of the second dielectric layer 240 over the overhangs 230. In an embodiment the formation of the second dielectric layer 240 is performed as described above with respect to FIGS. 10A-10C. For example, in an embodiment the second dielectric layer 240 is formed using a chemical vapor deposition process that closes the second openings 226b and forms the third thickness $T_3$ over the second etch stop layer 226. However, with the presence of the overhangs 230 already in place, the deposition of the material of the second dielectric layer 240 more easily seals off the second opening 226b without a substantial deposition of material within the second opening 226b to form the desired air gap 242. As such, the air gap 242 may be larger and better isolate the conductive features 210b.

Additionally, once the second opening 226b has been sealed off, the deposition of the second dielectric layer 240 may be continued until the second dielectric layer 240 has reached the third thickness $T_3$. Once the third thickness $T_3$ has been reached, the second dielectric layer 240 may be planarized to the fourth thickness $T_4$ (not individually illustrated in FIG. 13 but illustrated and described above with respect to FIG. 11), and additional processing may be performed as described above with respect to FIG. 11. For example, the second metallization layer ($M_{x+1}$) may be formed over the second openings 226b, and connected to the conductive feature 210b utilizing a via ($V_x$). However, any other suitable processing may alternatively be performed.

By utilizing a non-conformal deposition process during the manufacturing of the second etch stop layer 226, the overhangs 230 may be formed and will assist in forming and sealing off the air gap 242 during the deposition of the second dielectric layer 240. Such processing flexibility assists in the overall integration of the formation of the air gap 242 with other processes. Such integration allows for an overall more efficient process.

FIGS. 14 through 21 illustrate cross-sectional views of intermediate stages in the formation of a second semiconductor device 1400 having an interconnect structure in accordance with another alternative embodiment of the present disclosure. In this embodiment the second semiconductor device 1400 may be formed by initially utilizing the substrate 202, the dielectric layer 204, diffusion barrier layer 208, and the conductive features 210b as described above with respect to FIGS. 1-4. Additionally, however, prior to formation of the first etch stop layer 212, capping layers 250 are formed over the conductive features 210b. The capping layers 250 are utilized to improve the electromigration characteristics of the conductive features 210b.

In an embodiment the capping layers 250 comprise a conductive material such as a metal-containing layer. In particular embodiments the capping layers 250 comprise cobalt, copper, tungsten, aluminum, manganese, ruthenium, tantalum, combinations of these, alloys thereof, or the like. However, any suitable material that can improve the electromigration of the conductive features 210b may alternatively be utilized.

The capping layers 250 may be formed by a deposition process including plasma vapor deposition (PVD), plasma-enhanced chemical vapor deposition (PECVD), low-pressure chemical vapor deposition (LPCVD), chemical vapor deposition (CVD), plasma-enhanced atomic layer deposition (PEALD), electroless plating, sputtering, the like, or a combination thereof. In some embodiments the capping layers 250 are formed at a process temperature from about room temperature to about 600 degrees Celsius and at a pressure from about 0 Torr to about 100 Torr. In some embodiments, the capping layers 250 are selectively formed on the conductive features 210b. In other embodiments, the capping layers 250 are formed entirely over the second semiconductor device 1400 and then subjected to a patterning process to remove the portions of the capping layer 250 on the dielectric layer 204, while leaving remaining portions of the capping layer 250 on the conductive features 210b and/or the diffusion barrier layer 208.

In an embodiment the capping layers 250 may be formed to cover the material of the conductive features 210b without covering the adjacent diffusion barrier layer 208. However, in alternative embodiments, in order to ensure that the conductive material of the conductive features 210b are sealed, the capping layers 250 may be formed over the diffusion barrier layer 208 (or any other barrier layers or adhesion layers as well) as well as the conductive material of the conductive features 210b. Any combination of coverages may alternatively be utilized, and all such combinations are fully intended to be included within the scope of the embodiments.

By forming the capping layers 250 over the conductive features 210b, the capping layers will have a top surface that is further away from the substrate 202 than the top surface of the conductive features 210b. In some embodiments, the capping layers 250 have a fifth thickness $T_5$ of less than about 500 Å, such as between about 5 Å to about 100 Å.

Figure 15:
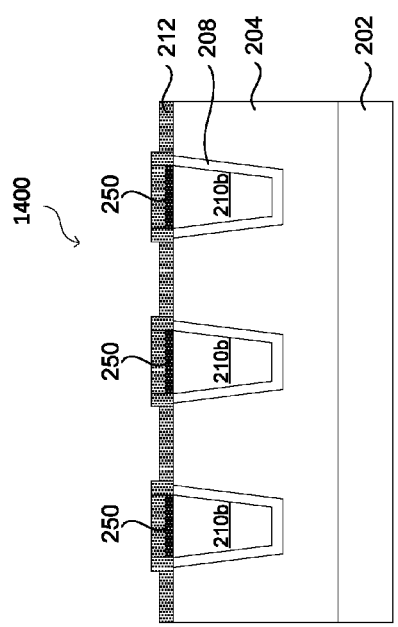

FIG. 15 illustrates the deposition of the first etch stop layer 212. In this embodiment, however, the first etch stop layer 212 is deposited over the capping layers 250 as well being deposited over the dielectric layer 204, the conductive features 210b, and the diffusion barrier layer 208. In an embodiment the first etch stop layer 212 is formed as described above with respect to FIG. 5. For example, the first etch stop layer 212 may be a material such as silicon oxide formed using a deposition process such as CVD. However, any other suitable material and process may alternatively be utilized.

Figure 16:
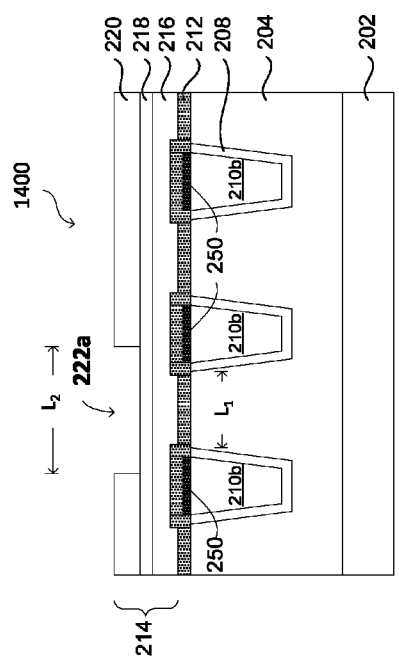

FIG. 16 illustrates the formation of the mask 214 over the first etch stop layer 212 and patterned to form the patterned photoresist layer or mask 214 having the first opening 222a. In an embodiment the mask 214 is formed as described above with respect to FIG. 6. For example, the mask 214 may be a tri-layer photoresist layer having the bottom layer 216, the middle layer 218, and the top layer 220. Additionally, the top layer 220 is patterned to form the first opening 222a having the second length $L_2$ that is greater than the first length $L_1$.

Figure 17:
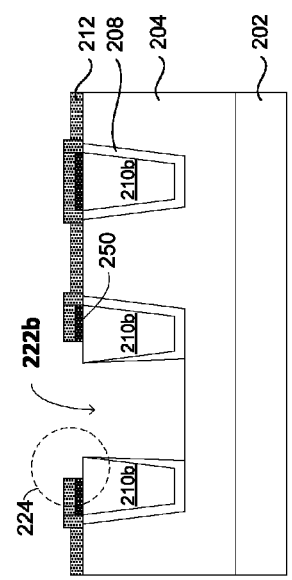

FIG. 17 illustrates the use of the mask 214 to extend the first opening 222a through the middle layer 218, the top layer 220, the first etch stop layer 212, and the capping layer 250 to form the second opening 222b. The etching process, by patterning the capping layer 250, will also expose the corner portions 224 of the conductive features 210b. Once the capping layer 250 and the first etch stop layer 212 have been patterned, portions of the dielectric layer 204 between the conductive features 210b may be removed to form the second opening 222b.

In an embodiment the first etch stop layer 212, the capping layers 250, the diffusion barrier layer 208 in some embodiments, and the dielectric layer 204 exposed by the first opening 222a of the mask 214 are removed by one or more etch processes such as a dry etch, wet etch, or combinations thereof. In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the second opening 222b. Other dry-etch process may alternatively be used. The mechanism of etching in each dry-etch process may have a physical basis (e.g., glow-discharge sputtering, or ion milling) or a chemical basis (e.g., in pure plasma etching) or a combination of the two (e.g., reactive ion etching or RIE). Thereafter, the mask 214 may be removed by a process such as wet stripping or $O_2$ plasma ashing.

Figure 18:
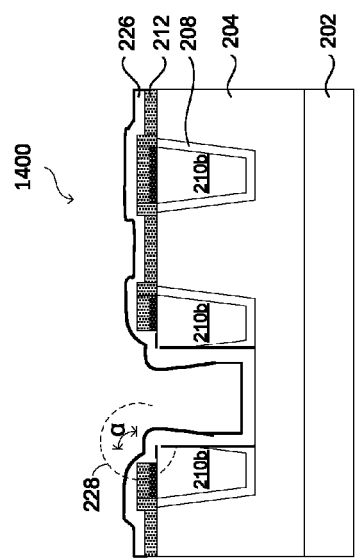

FIG. 18 illustrates the deposition of the second etch stop layer 226. However, in this embodiment the second etch stop layer 226 is deposited over the capping layer 250 as well as over the first etch stop layer 212, the dielectric layer 204, the conductive features 210b, and in some embodiments over the diffusion barrier layer 208. In some embodiments, the second etch stop layer 226 prevents metal or copper diffusion from the portions of the conductive features 210b that have been exposed during the etching of the dielectric layer 204. In an embodiment the second etch stop layer 226 is formed as described above with respect to FIG. 8. For example, the second etch stop layer 226 may be formed using a conformal deposition process such as chemical vapor deposition in order to seal the material of the conductive features 210b and line the sidewalls of the second opening 222b. In some embodiments, the second etch stop layer 226 has a thickness of less than about 1,000 Å, such as being between about 5 Å to about 300 Å.

Alternatively, the second etch stop layer 226 may be formed using a non-conformal deposition process as described above with respect to FIG. 12. For example, the second etch stop layer 226 may be formed using a plasma vapor deposition process, which will also form the overhangs 230 (not separately illustrated in FIG. 18) that will extend outwards over the second openings 226b and assist in the formation of the air gaps 242.

Figure 19:
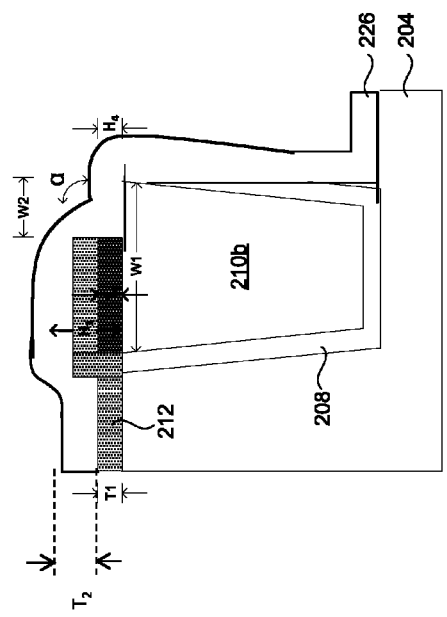

FIG. 19 illustrates a blown up view of a portion of the semiconductor device 200 showing various dimensions of the parts of the second semiconductor device 1400, such as the capping layer 250, the first etch stop layer 212, the second etch stop layer 226, and the conductive features 210b. In some embodiments the combined layers of the capping layer 250 (with the fifth thickness $T_5$), the first etch stop layer 212 (with the first thickness $T_1$), and the second etch stop layer (with the second thickness $T_2$), may have a total third height $H_3$ that is determined by the following formula:

$$H_3 = T_5 + T_1 + T_2$$

Additionally, within the stepped structure 228 itself, the material within the stepped structure may have a fourth height $H_4$ that in some embodiments may be the second thickness $T_2$ of the second etch stop layer 226. Additionally, in other embodiments the first etch stop layer 212 may not be fully removed from the stepped structure and, as such, the fourth height $H_4$ of material within the stepped structure may comprise the second thickness $T_2$ as well as the leftover material from the first etch stop layer 212 ($T_2$+partial $T_1$). Also, in other embodiments the capping layer 250 may not be fully removed during the etch process, and the fourth height $H_4$ of material within the stepped structure may comprise the second thickness $T_2$ (of the second etch stop layer 226) and all of or a portion of the capping layer 250 ($T_2$+partial $T_5$). Any suitable combination of thicknesses of materials within the stepped structure may alternatively be utilized.

Figure 20:
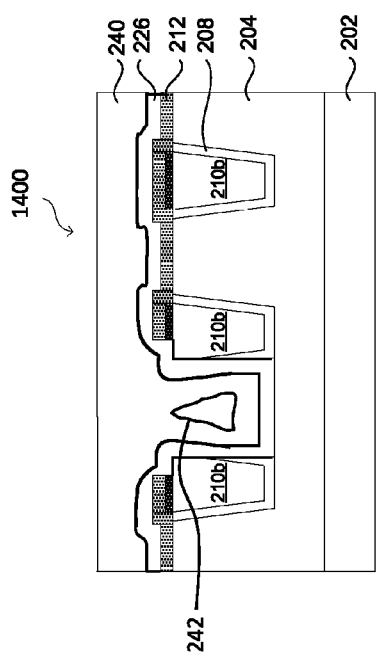

FIG. 20 illustrates a deposition of the second dielectric layer 240 over the second etch stop layer 226. In an embodiment the second dielectric layer 240 is deposited as described above with respect to FIGS. 10A-10C. For example, the second dielectric layer 240 may be a dielectric material such as silicon oxide deposited using a chemical vapor deposition process. Additionally, the deposition process may be tuned to have a large enough rate of deposition that the deposition process will form the air gap 242 within the second opening 222b, thereby helping to isolate adjacent ones of the conductive features 210b from each other.

Additionally, the deposition of the second dielectric layer 240 will also form the second dielectric layer 240 to a thickness over the second etch stop layer 226 that is sufficient to protect the air gap 242 from being damaged or reopened during subsequent processing. For example, the deposition of the second dielectric layer 240 may be continued until the second dielectric layer 240 has the third thickness $T_3$ over the second etch stop layer 226 and then planarized using, e.g., a chemical mechanical polishing process to reduce the second dielectric layer 240 to the fourth thickness $T_4$.

Figure 21:
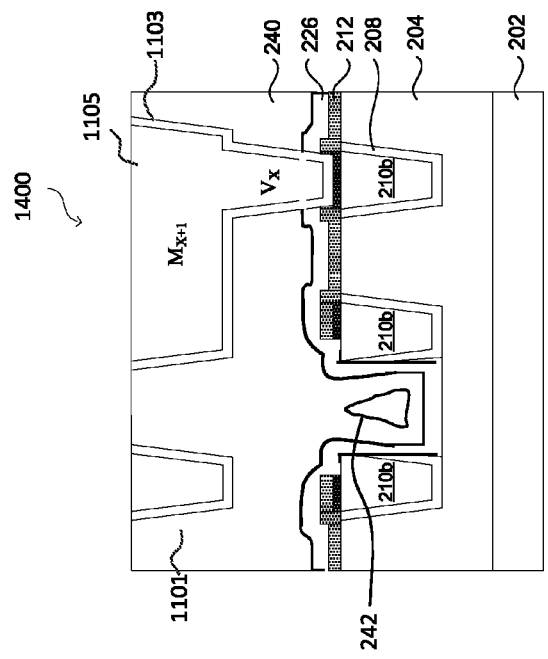

FIG. 21 illustrates a formation of the second metallization layer ($M_{x+1}$) over the second dielectric layer 240 and in electrical contact with one of the conductive features 210b. In an embodiment the second metallization layer ($M_{x+1}$) may be formed as described above with respect to FIG. 11. For example, the third dielectric layer 1101 may be deposited and then the second metallization layer ($M_{x+1}$) and the connecting via ($V_x$) may be formed within the third dielectric layer 1101 using, e.g., a damascene or dual damascene process.

It will be appreciated that the embodiments of the present disclosure may be iteratively performed to form multiple metallization layers one stacked upon another in a back-end-of-the-line stack. It is also understood that the dimensions recited are merely examples, and will change with the scaling down of integrated circuits. It is further understood that second semiconductor device 1400 shown in FIGS.

14-21 are only for illustrative purpose and are not limiting. Additional steps may be performed such as forming multiple metallization layers and further processes may be used to complete the fabrication and packaging of the semiconductor device. Also, it should be understood that the ordering of the various steps discussed above with reference to FIGS. 14-21 are provided for illustrative purposes, and as such, other embodiments may utilize different sequences. These various ordering of steps are to be included within the scope of embodiments. Additional embodiments can also be conceived.

Advantages of one or more embodiments of the present disclosure may include one or more of the following.

In one or more embodiments, since air gaps have a k value equal to 1, the equivalent k value of the dielectric material in the interconnect structures is lowered, resulting in a reduction in the parasitic capacitance between metal lines. This results in increased speed and better overall performance of the IC device.

In one or more embodiments, the formation of the air gaps is uniform and controllable, and does not suffer from the permeable (porous) hard mask collapsing problem that may occur in conventional methods for forming air gaps.

In one or more embodiments, the processes disclosed herein are compatible with existing semiconductor fabrication flow. Therefore, the embodiments of the present disclosure will not be expensive to implement.

Various aspects of the present disclosure have been described. According to one aspect of this description, a method for fabricating a semiconductor device comprising forming a plurality of conductive features within a first dielectric layer over a substrate and forming a first etch stop layer over the plurality of conductive features is provided. A first opening is formed through the first etch stop layer to at least partially expose a first top surface of a first one of the plurality of conductive features and to expose a second top surface of a second one of the plurality of conductive features. A portion of the first dielectric layer is removed between the first one of the conductive features and the second one of the conductive features to form a second opening. The second opening is lined with a second etch stop layer, wherein the second etch stop layer extends over the first etch stop layer. A dielectric material is deposited into the second opening, wherein the depositing the dielectric material further comprises forming an air gap within the second opening.

According to another aspect of this description, a method for forming an interconnect structure comprising forming a first conductive line and a second conductive line within a dielectric layer over a substrate and forming a first etch stop layer over the first conductive line and the second conductive line is provided. A portion of the first etch stop layer to is removed to expose a first corner of the first conductive line and a second corner of the second conductive line. A portion of the dielectric layer is removed between the first conductive line and the second conductive line to form a first opening. A second etch stop layer is deposited over the first etch stop layer and within the first opening, and a dielectric material is deposited within the first opening, wherein the depositing the dielectric material seals a void at least partially within the first opening.

According to yet another aspect of this description, a semiconductor device having an interconnect structure comprising a metal interconnect layer having a first conductive feature and a second conductive feature within a dielectric layer overlying a substrate is provided. An etch stop layer having a stepped profile is located over a first corner of the first conductive feature. A dielectric material is located adjacent to the etch stop layer between the first conductive feature and the second conductive feature. An air gap is located within the dielectric material between the first conductive feature and the second conductive feature.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A method for fabricating a semiconductor device, the method comprising:
    forming a plurality of conductive features within a first dielectric layer over a substrate;
    forming a first etch stop layer over the plurality of conductive features;
    forming a first opening through the first etch stop layer to at least partially expose a first top surface of a first one of the plurality of conductive features and to expose a second top surface of a second one of the plurality of conductive features;
    removing a portion of the first dielectric layer between the first one of the conductive features and the second one of the conductive features to form a second opening;
    lining the second opening with a second etch stop layer, wherein the second etch stop layer extends over the first etch stop layer; and
    depositing a dielectric material into the second opening, wherein the depositing the dielectric material further comprises forming an air gap within the second opening.

2. The method of claim 1, wherein the forming the plurality of conductive features further comprises:
    forming a barrier layer; and
    forming a conductive material adjacent to the barrier layer.

3. The method of claim 1, wherein the lining the second opening is performed at least in part with a conformal deposition process.

4. The method of claim 1, wherein the lining the second opening is performed at least in part with a non-conformal deposition process.

5. The method of claim 4, wherein the lining the second opening forms a first overhang at a first corner of the second opening and a second overhang at a second corner of the second opening opposite the first corner.

6. The method of claim 5, wherein the first overhang is separated from the second overhang by a distance no greater than 100 nm.

7. The method of claim 1, further comprising forming a capping layer over the plurality of conductive features prior to the forming the first etch stop layer.

8. A method for forming an interconnect structure, comprising:
    forming a first conductive line and a second conductive line within a dielectric layer over a substrate;
    forming a first etch stop layer over the first conductive line and the second conductive line;

removing a portion of the first etch stop layer to expose a first corner of the first conductive line and a second corner of the second conductive line;

removing a portion of the dielectric layer between the first conductive line and the second conductive line to form a first opening;

depositing a second etch stop layer over the first etch stop layer and within the first opening; and depositing a dielectric material within the first opening, wherein the depositing the dielectric material seals a void at least partially within the first opening.

9. The method of claim 8, wherein the depositing the second etch stop layer is performed at least in part using a conformal deposition process.

10. The method of claim 8, wherein the depositing the second etch stop layer is performed at least in part using a physical vapor deposition process.

11. The method of claim 10, further comprising forming overhangs along corners of the first opening.

12. The method of claim 11, wherein the overhangs form a second opening with a width no greater than 100 nm.

13. The method of claim 8, wherein the depositing the first opening has a first length and a first depth, wherein a ratio of the first depth to the first length is between 2 and 5.

14. The method of claim 8, wherein the depositing a second etch stop layer forms a stepped structure, wherein a step angle of the stepped structure is between 30° and 90°.

15. The method of claim 8, further comprising planarizing the dielectric material after the depositing the dielectric material, wherein the planarizing the dielectric material does not reopen the void.

16. A method of manufacturing a semiconductor device, the method comprising:

depositing a dielectric layer overlying a substrate;

forming a metal interconnection layer within the dielectric layer, the metal interconnection layer comprising a first conductive feature and a second conductive feature;

after the forming the metal interconnection layer, removing a portion of the dielectric layer between the first conductive feature and the second conductive feature, wherein the removing the portion of the dielectric layer also exposes a first corner of the first conductive feature and a second corner of the second conductive feature;

depositing an etch stop layer over the first corner of the first conductive feature, the etch stop layer having a stepped profiled after the depositing the etch stop layer; and depositing a dielectric material adjacent to the etch stop layer between the first conductive feature and the second conductive feature, wherein the depositing the dielectric material is performed at a deposition rate of at least between about 1 nm/s and 10 nm/s to form an air gap in the dielectric material between the first conductive feature and the second conductive feature.

17. The method of claim 16, further comprising depositing a capping layer located at least partially on the first conductive feature.

18. The method of claim 16, further comprising:

forming a first etch stop layer over the first conductive feature and the second conductive feature; and forming a first opening through the first etch stop layer to expose a first portion of the first conductive feature and a second portion of the second conductive feature, the first opening having a first width parallel to a major surface of the substrate, wherein the removing the portion of the dielectric layer between the first conductive feature and the second conductive feature forms a second opening between the first conductive feature and the second conductive feature, the second opening having a second width less than the first width.

19. The method of claim 18, wherein the first portion of the first conductive feature has a third width that is between 10% and 80% of the first width.

20. The method of claim 16, further comprising planarizing the dielectric material, wherein after the planarizing the dielectric material the dielectric material has a thickness over the etch stop layer of between about 10 Å and about 2000 Å.

\* \* \* \* \*